United States Patent
Albuisson et al.

(10) Patent No.: US 11,714,116 B2
(45) Date of Patent: Aug. 1, 2023

(54) DETECTION AND MEASUREMENT UNIT FOR DETECTING ELECTROMAGNETIC INTERFERENCE, DETECTION SYSTEM COMPRISING SUCH AN ANALYSIS UNIT AND ANALYSIS METHOD

(71) Applicants: COMMISSARIAT A L'ENERGIE ATOMIQUE ET AUX ENERGIES ALTERNATIVES, Paris (FR); INOVEOS, Brive la Gaillarde (FR)

(72) Inventors: Nicolas Albuisson, Vegennes (FR); Nicolas Ribiere-Tharaud, Brive la Gaillarde (FR); Maxime Schutz, Brive la Gaillarde (FR)

(73) Assignees: COMMISSARIAT A L'ENERGIE ATOMIQUE ET AUX ENERGIES ALTERNATIVES, Paris (FR); INOVEOS, Brive la Gaillarde (FR)

( * ) Notice: Subject to any disclaimer, the term of this patent is extended or adjusted under 35 U.S.C. 154(b) by 0 days.

(21) Appl. No.: 17/651,630

(22) Filed: Feb. 18, 2022

(65) Prior Publication Data

US 2022/0268823 A1  Aug. 25, 2022

(30) Foreign Application Priority Data

Feb. 19, 2021 (FR) ...................... 21 01639

(51) Int. Cl.
*G01R 31/00* (2006.01)
*G01R 29/08* (2006.01)

(52) U.S. Cl.
CPC ....... *G01R 31/001* (2013.01); *G01R 29/0892* (2013.01)

(58) Field of Classification Search
CPC .............. G01R 31/001; G01R 29/0892; G01R 29/0871; H04B 1/71637

(Continued)

(56) References Cited

U.S. PATENT DOCUMENTS 4,634,896 A * 1/1987 Shrinkle .............. H03K 5/1532
327/76
4,789,838 A * 12/1988 Cheng .............. G11B 20/10009
327/31

(Continued)

FOREIGN PATENT DOCUMENTS

EP    3157181 A1 * 4/2017 ............. G01R 23/18
EP    3 157 181 B1    12/2017

(Continued)

OTHER PUBLICATIONS

French Preliminary Search Report dated Nov. 24, 2021 in French Application 21 01639 filed on Feb. 19, 2021, 3 pages (with English Translation of Categories of Cited Documents).

*Primary Examiner* — Christopher P McAndrew
(74) *Attorney, Agent, or Firm* — Oblon, McClelland, Maier & Neustadt, L.L.P.

(57) ABSTRACT

A detection and measurement unit for detecting electromagnetic interference, the detection and measurement unit being configured to receive a representative digital signal. The detection and measurement unit includes a detection subunit configured to compare the amplitude of the representative digital signal with a first triggering threshold and a second stopping threshold. The second stopping threshold corresponds to an amplitude less than that of the first triggering threshold. The detection subunit is configured to detect an electromagnetic pulse on each detection of the passage of the amplitude of the representative digital signal through the second stopping threshold in a falling edge after the amplitude of the representative digital signal.

14 Claims, 4 Drawing Sheets

(58) Field of Classification Search
USPC .......................................................... 324/457
See application file for complete search history.

(56) References Cited

U.S. PATENT DOCUMENTS

| | | | | |
|---|---|---|---|---|
| 5,150,050 | A | * | 9/1992 | Genheimer ........ G01R 33/1207 |
| 5,495,368 | A | | 2/1996 | Blatchley et al. |
| 5,514,987 | A | | 5/1996 | Ramirez |
| 5,877,644 | A | * | 3/1999 | Christensen ..... G11B 20/10037 |
| | | | | 327/308 |
| 5,949,597 | A | * | 9/1999 | Pahr ................ G11B 20/10009 |
| | | | | 360/65 |
| 6,975,158 | B2 | * | 12/2005 | Sekimoto ............. H03K 5/1252 |
| | | | | 327/558 |
| 2008/0090606 | A1 | * | 4/2008 | Hwang ................ H04B 7/0868 |
| | | | | 455/553.1 |
| 2009/0197554 | A1 | * | 8/2009 | Shi ....................... H04B 1/1036 |
| | | | | 455/226.2 |
| 2014/0080417 | A1 | * | 3/2014 | Kyles ....................... H04B 5/02 |
| | | | | 455/41.2 |
| 2016/0248482 | A1 | | 8/2016 | Kyles et al. |
| 2017/0077997 | A1 | | 3/2017 | Kyles et al. |
| 2017/0212161 | A1 | | 7/2017 | Hoad et al. |
| 2017/0299642 | A1 | | 10/2017 | Ribiere-Tharaud |

FOREIGN PATENT DOCUMENTS

| | | | | | |
|---|---|---|---|---|---|
| GB | | 2546520 A | * | 7/2017 | ....... G01R 19/16528 |
| JP | | 10-104281 A | | 4/1998 | |

* cited by examiner

DETECTION AND MEASUREMENT UNIT FOR DETECTING ELECTROMAGNETIC INTERFERENCE, DETECTION SYSTEM COMPRISING SUCH AN ANALYSIS UNIT AND ANALYSIS METHOD

TECHNICAL FIELD

The invention relates to the field of detecting electromagnetic interference in order to prevent the harmful effects of such electromagnetic interference.

The invention relates more specifically to a detection and measurement unit for detecting electromagnetic interference, a system for detecting such electromagnetic interference, and a detection and measurement method.

PRIOR ART

Figure 1:
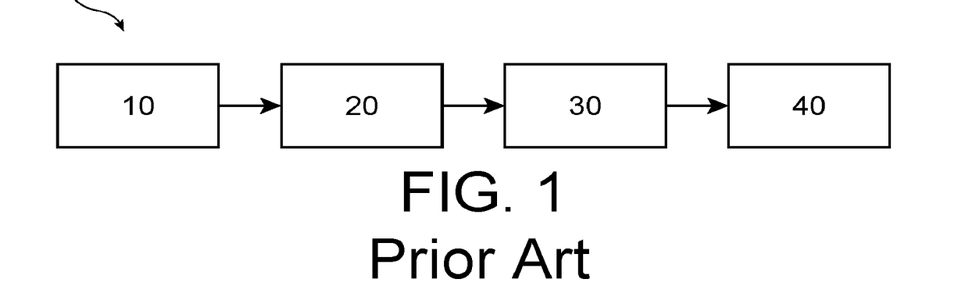
FIG. 1 illustrates the main elements of a system for detecting electromagnetic interference whether according to the prior art or according to the invention.

Systems for detecting electromagnetic interference, or electromagnetic pulses, are intended to monitor civilian or military installations in respect of varied intentional electromagnetic constraints across a wide frequency band, such as for example ultra-wide band (UWB) electromagnetic waves. Such systems 1 comprise, as illustrated in FIG. 1:
- a device for detecting ultra-wide band signals including one or more antennae 10, the detection device being capable of being equipped with a limiter to protect the downstream electronic components,
- a processing and digitising unit 20 for processing and digitising the electromagnetic signal received by the detection device, the processing an digitising being adapted to supply from the electromagnetic signal at least one representative digital signal of the envelope of the electromagnetic signal received in at least a given frequency band,
- a measurement and detection unit 30 configured to receive the at least one representative digital signal supplied by the processing unit and to identify and measure the electromagnetic pulses,
- an analysis unit 40 for analysing the measurements supplied by the detection and measurement unit.

In a routine configuration of systems for detecting electromagnetic interference, the detection and measurement unit 30 is generally supplied by means of a digital processing architecture based on the acquisition of the representative digital signal(s) and, after a storage step, a data processing operation to detect and measure the electromagnetic pulses in the stored data. This type of configuration particularly corresponds to that used by means of a digital oscilloscope and other acquisition board.

However, such acquisitions require a relatively large storage memory. Indeed, on the basis of a sampling frequency at 100 MHz and a signal having a relatively low repeat frequency therefore requiring an acquisition time of 3s, it is necessary to store 300 million samples, i.e., for 8-bit-encoded values, a memory of 300 MB.

For this reason and for such a routine configuration, the detection and analysis units are relatively complex and require a relatively large storage capacity.

In order to simplify these detection and analysis units, some documents, such as the document US 2017/0212161, propose using simplified electromagnetic pulse detection based on a comparison of the representative digital signal supplied by the ultra-wide band signal detection device with a simple threshold. While such use of simplified detection opens up the possibilities of simple real-time detection and analysis, it is nonetheless not satisfactory. Indeed, such a solution for distinguishing electromagnetic pulses is not reliable and can induce the detection of false positives or cause poorer detection.

Thus, at present, there is no detection and measurement unit enabling simple, rapid and reliable detection and measurements of electromagnetic pulses, particularly to allow real-time analysis of the representative digital signal.

DESCRIPTION OF THE INVENTION

The invention is intended to resolve the drawbacks listed above and thus its aim is that of providing a detection and measurement unit which allows a detection and a measurement of electromagnetic pulses that are simpler and more rapid that those used by detection and measurement units of the prior art at a reduced cost.

To this end, the invention relates to a detection and measurement unit for detecting electromagnetic interference, the detection and measurement unit being configured to receive a representative digital signal of the envelope of an electromagnetic signal received in a given frequency band wherein electromagnetic interference is liable to occur, the detection and measurement unit comprising:
- a detection subunit configured to compare the amplitude of the representative digital signal with a first triggering threshold and a second stopping threshold, the second stopping threshold corresponding to an amplitude less than that corresponding to the first triggering threshold, the detection subunit being furthermore configured to detect an electromagnetic pulse on each detection of the passage of the amplitude of the representative digital signal through the second stopping threshold in a falling edge after the amplitude of the representative digital signal has passed through the first triggering threshold in a rising edge.

The detection and measurement unit comprises a programmable logic circuit which was previously programmed to act as a detection subunit.

Such a unit makes it possible to provide simple electromagnetic pulse detection, since it is based on a simple amplitude comparison with threshold values, while being reliable due to the use of a double threshold instead of a single threshold which may cause, as discussed hereinafter with reference to FIGS. 3A and 3B, either the detection of false positives (tripled pulses in the example provided) in the case of an excessively low threshold, or excessively low pulse detection (only the pulses having the greatest amplitudes are then detected). Thus, such a simplification and reliability of the detection allows the development of detection units capable of operating in real time without requiring substantial storage to enable post-processing of the representative digital signal. It is perfectly reliable when it perform, as it is the case in the invention, using programmable logic circuit type circuits. So it is possible, thanks to the invention, to provide a detection and a measurement of electromagnetic pulses simple, rapid and at reduced cost than the previous art solution.

The detection and measurement unit can further comprise a temporal pulse duration measurement subunit communicating with the detection subunit, the temporal pulse duration measurement subunit being configured to measure the duration of pulse/s between the passages by the amplitude of the representative digital signal of the first triggering threshold in a rising edge and the passage of the second stopping threshold in a falling edge.

In this way, the detection and measurement unit is capable of determining the duration of the electromagnetic pulses using the temporal pulse measurement subunit by simply monitoring the output of the detection subunit.

The detection subunit can comprise:
- a first comparator adapted to compare the amplitude of the representative digital signal with the first triggering threshold, the first comparator having a first state when the amplitude of the digital representative signal is less than, or is less than or equal to, the first triggering threshold and a second state otherwise,
- a second comparator adapted to compare the amplitude of the representative digital signal with the second stopping threshold, the second comparator having a third state when the amplitude of the digital representative signal is greater than, or greater than or equal to, the second stopping threshold and a fourth state otherwise,
- a first latch having a first latch input connected to the first comparator and a second latch input connected to the second comparator, the first latch being configured to switch from a fifth state to a sixth state when the first comparator has the second state, and to switch from the sixth state to the fifth state when the second comparator has the fourth state,
- a pulse counter connected to an output of the first latch and configured to count a pulse each time the first latch switches from a state chosen from the sixth state and the fifth state to the other state from the sixth state and the fifth state.

Such a functional configuration of the detection subunit offers the possibility of providing such a detection subunit using a simple logic circuit and it is possible to implement it using a programmable logic circuit used in the case of the invention.

It will be noted furthermore that "counting a pulse each time the first latch switches from a state chosen from the sixth state and the fifth state to the other state from the sixth state and the fifth state" means that a pulse is counted:
- either only on switching from the fifth state to the sixth state, the fifth state then being the chosen state,
- or only on switching from the sixth state to the fifth state, the sixth state then being the chosen state.

It will be noted that, by analogy, hereinafter in this document, each time a state is chosen from two states for a switch from said chosen state to the other (therefore non-chosen) state, the condition is only met on switching from the chosen state to the other state, the chosen state being a predefined data item.

The temporal pulse duration measurement subunit can comprise:
- a first clock configured to have in alternation a seventh state and an eighth state with a first predefined alternating frequency,
- a first logic gate having a first gate input connected to an output of the first latch and a second gate input connected to the first clock, the first logic gate being configured to have a ninth state when the first latch has the sixth state and when the clock has the seventh state, the first logic gate having a tenth state the rest of the time,
- a pulse duration counter connected to an output of the first logic gate and configured to count a first clock pulsation each time the first logic gate has the ninth state, the number of alternations counted corresponding to the pulse duration.

In the same way as the detection subunit, such a functional configuration of the temporal pulse duration measurement subunit could be easily implemented using a simple logic circuit and thus to be programmed using a programmable logic circuit as it is the case for the invention.

The detection and measurement unit can further comprise a maximum pulse amplitude measurement subunit capable of measuring a maximum amplitude level reached by the representative digital signal.

In this way, it is possible to obtain information on the amplitude of the electromagnetic pulses detected during the measurement duration considered.

The maximum pulse amplitude measurement subunit can comprise a plurality of comparison units each comprising a third comparator and respective latch,
the third comparator of each comparison unit being adapted to compare the amplitude of the representative digital signal with a respective third triggering threshold which is different from the third triggering threshold of the other third comparators, said third comparator having an eleventh state when the amplitude of the digital representative signal is less than, or less than or equal to, the corresponding third triggering threshold and a twelfth state otherwise,
the third latch of each comparison unit having a third latch input connected to the third comparator of said comparison unit, said third latch being configured to switch from a thirteenth state to a fourteenth state when the third comparator of said comparison unit has the twelfth state,
the comparison units being configured so that the third triggering thresholds of the third comparators are distributed over a range of expected amplitudes for the representative digital signal.

Such a functional configuration of the maximum pulse amplitude measurement subunit offers could be implemented using a simple logic circuit and thus could be easily implemented on a programmable logic circuit as used in the case of the invention.

The detection and measurement unit can comprise an electromagnetic pulse repeat period measurement subunit.

Such a period measurement subunit makes it possible to estimate a repeat frequency of these electromagnetic pulses and thus better identify the risks associated with these electromagnetic pulses.

The electromagnetic repeat frequency measurement subunit can comprise:
- a frequency divider configured to switch between a fifteenth state and sixteenth state on each switch of the first latch to a given state from the fifth state and the sixth state,
- a double-period number counter connected to an output of the frequency divider and configured to count a double-period each time the frequency divider switches from a state chosen from the fifteenth state and the sixteenth state to the other state from the fifteenth state and sixteenth state,
- a second clock configured to have in alternation a seventeenth state and an eighteenth state with a second predefined alternating frequency,
- a second logic gate having a third gate input connected to an output of the frequency divider and a fourth gate input connected to the second clock, the second logic gate being configured to have a nineteenth state when the frequency divider has the fifteenth state and when the second clock has the seventeenth state, the logic gate having a twentieth state the rest of the time,
- a period duration counter connected to an output of the second logic gate and configured to count a second clock pulsation each time the frequency divider switches from a state chosen from the fifteenth state and the sixteenth state to the other state from the fifteenth state and the sixteenth state.

Such a functional configuration of the electromagnetic pulse repeat frequency measurement subunit, in the same way as the other subunits, could be implemented using a simple logic circuit and thus makes it possible, for example, be able to program using a programmable logic circuit as used in the case of the invention.

The detection and measurement unit can comprise a buffer memory configured to retrieve the period duration counter on each switch of the frequency divider from the sixteenth state to the fifteenth state.

The detection subunit can be configured to receive a reset signal and to carry out, on receiving this reset signal, a supply of a number of electromagnetic pulses detected since a previous reset and a reset to zero of a counting of the number of electromagnetic pulses.

The programmable logic circuit is preferably a complex programmable logic circuit, better known under the acronym CPLD.

Such a programmable logic circuit makes it possible to provide a detection unit which can be custom-adapted for reduced costs.

The invention furthermore relates to a system for detecting electromagnetic interference comprising:
  a unit for receiving electromagnetic signals configured to receive at least a portion of the electromagnetic radiation to which the detection system is subjected in the form of an electromagnetic signal received in a given frequency band and to supply a representative digital signal of the envelope of said electromagnetic signal,
  an analysis unit according to the invention.

Such a detection system has the advantages associated with the analysis unit according to the invention comprised therein.

The invention furthermore relates to an analysis method for detecting electromagnetic interference, the method comprising the steps of:
  receiving a representative digital signal of the envelope of an electromagnetic signal received in a given frequency band wherein electromagnetic interference is liable to occur,
  comparing the amplitude of the representative digital signal with a first triggering threshold and a second stopping threshold, the second stopping threshold corresponding to an amplitude less than that corresponding to the first triggering threshold,
  detecting an electromagnetic pulse on each detection of the passage of the amplitude of the representative digital signal through the second stopping threshold in a falling edge after the amplitude of the representative digital signal has passed through the first triggering threshold in a rising edge.

Such a method can be used with an analysis unit according to the invention and thus benefit from the advantages associated therewith.

The analysis method for detecting electromagnetic interference can further comprise the steps of:
  supplying a first clock signal having a first predefined alternating frequency,
  modulating the first clock signal with an electromagnetic pulse detection signal supplied during the step of detecting an electromagnetic pulse,
  counting the remaining clock signal number after modulation with the electromagnetic pulse detection signal.

Such a method enables a simple measurement of the duration of the electromagnetic pulses.

BRIEF DESCRIPTION OF THE DRAWINGS

The present invention will be understood more clearly on reading the description of embodiment examples given merely by way of indication and in no way limitation with reference to the appended drawings wherein.

Identical, similar or equivalent parts of the different figures bear the same reference numbers so as to facilitate the transition from one figure to another.

The different parts represented in the figures are not necessarily on a uniform scale, in order to render the figures more readable.

The different possibilities (alternative embodiments and embodiments) should be understood as not being mutually exclusive and can be combined with one another.

DESCRIPTION OF EMBODIMENTS

FIG. 1 illustrates the main elements of a system for detecting electromagnetic interference whether according to the prior art or according to the invention, used for detecting electromagnetic interference.

Thus, such a detection system 1 comprises:
  a device for detecting ultra-wide band signals including one or more antennae 10, the detection device being capable of being equipped with a limiter to protect the downstream electronic components,
  a device 20 for processing and digitising the electromagnetic signal received by the detection device adapted to supply from the electromagnetic signal at least one representative digital signal of the envelope of the electromagnetic signal received in at least a given frequency band,
  a measurement and detection unit 30 configured to receive the at least one representative digital signal supplied by the processing unit and to identify and measure the electromagnetic pulses,
  an analysis unit 40 for analysing the measurements supplied by the detection and measurement unit.

The ultra-wide band signal detection device 10 and the processing and digitisation unit 20 according to the first embodiment of the invention can be according to those used within the scope of the prior art. In particular, the ultra-wide band signal detection device 10 and the processing and digitisation unit 20 can be according to the teaching of document EP 3157181 B1.

It will be noted that according to a standard configuration used in the prior art and particularly in the document EP 3157181 B1, the processing and digitisation unit 20 is adapted to supply several representative digital signals of the envelope of the electromagnetic signal received in separate frequency bands and the detection system 1 comprises for each of the frequency bands a separate detection and measurement unit 30 adapted to process the representative digital signal corresponding to said frequency band. Thus, while, for simplification reasons, only a single detection and measurement unit is described hereinafter, it is perfectly conceivable, without leaving the scope of the invention, for the detection system 1 to include a plurality of detection and measurement units 30.

Figure 2:
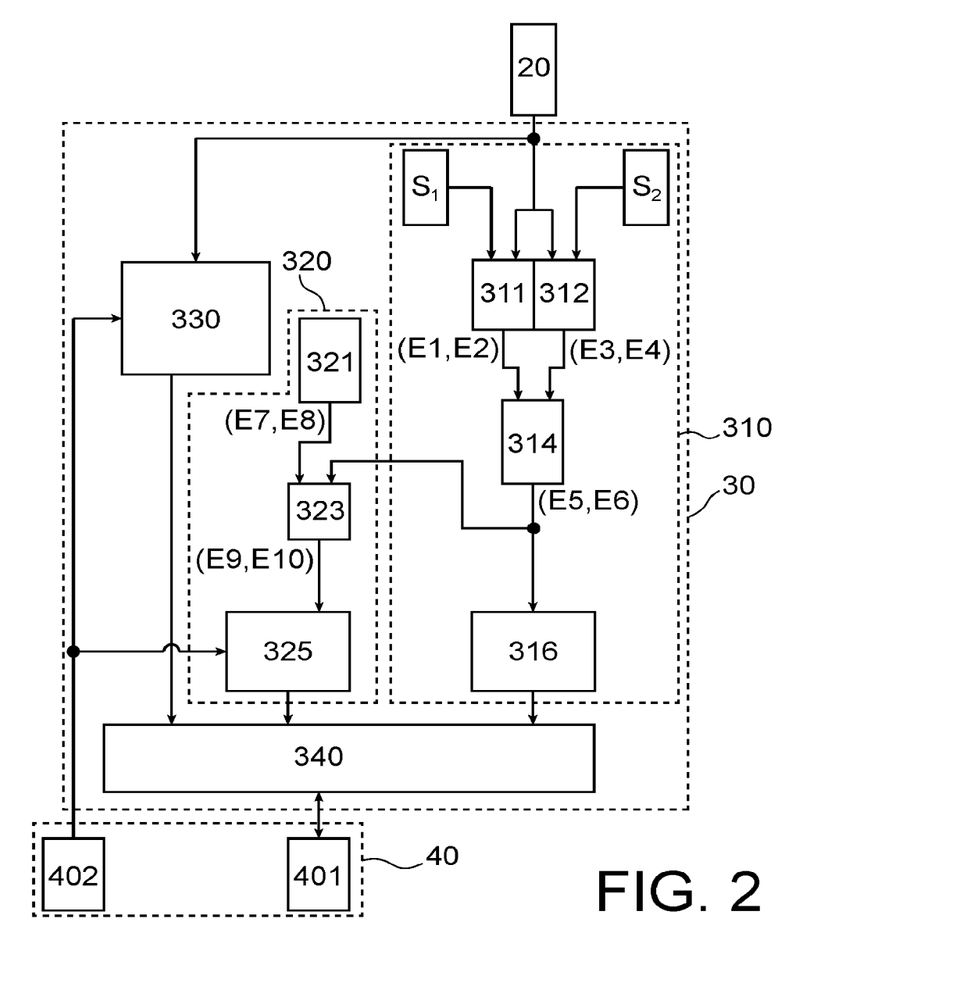
FIG. 2 illustrates a functional diagram of a unit for detecting and measuring electromagnetic interference according to the invention.
Figure 3A:
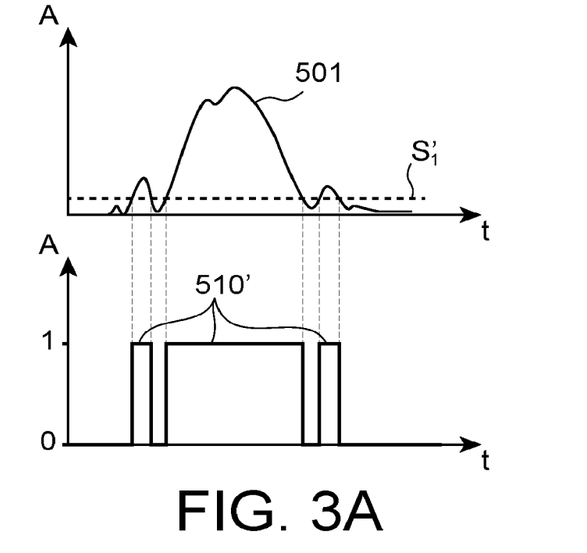
FIG. 3A illustrates the electromagnetic pulse detection principle used within the scope of methods according to the prior art.
Figure 3B:
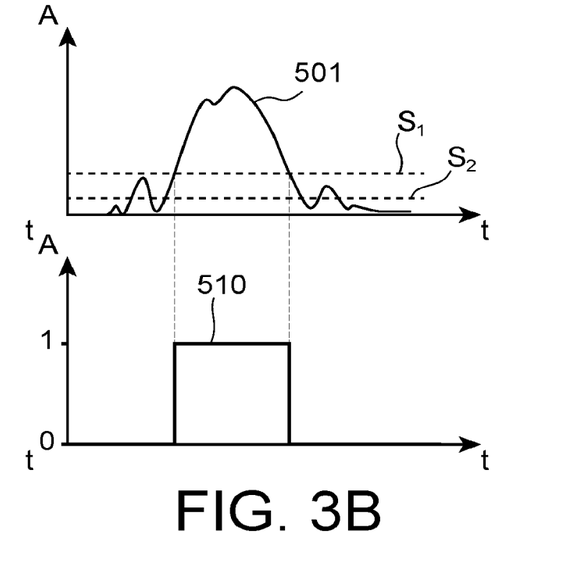
FIG. 3B illustrates the electromagnetic pulse detection principle based on the use of two threshold values according to the invention.

According to FIG. 2, according to the invention, the detection and measurement unit 30 comprises:
- a detection subunit 310 configured to compare the amplitude of the representative digital signal 501, as illustrated in FIGS. 3A and 3B, with a first triggering threshold S1 and a second stopping threshold S2, the second stopping threshold S2 corresponding to an amplitude less than that corresponding to the first triggering threshold S1, the detection subunit 310 being furthermore configured to detect an electromagnetic pulse on each detection of the passage of the amplitude of the representative digital signal through the second stopping threshold S2 in a falling edge after the amplitude of the representative digital signal has passed through the first triggering threshold S1 in a rising edge,
- a temporal pulse duration measurement subunit 320 communicating with the detection subunit 310, the temporal pulse duration measurement subunit 320 being configured to measure the pulse duration between the passages by the amplitude of the representative digital signal 501 of the first triggering threshold S1 in a rising edge and the passage of the second stopping threshold S2 in a falling edge,
- a maximum pulse amplitude measurement subunit 330 capable of measuring a maximum amplitude level reached by the representative digital signal 501,
- an interface subunit 340 to act as an interface between the other subunits 310, 320, 330 of the detection and measurement unit 30 and the analysis unit 40.

Such a detection and measurement unit 30 comprises a programmable logic circuit, not shown, which was previously programmed to act as at least part, or all, of the subunits 310, 320, 330, 340 of the detection and measurement unit 30, the programmable logic circuit being preferably a complex programmable logic circuit, better known under the acronym CPLD. According to this option, the programmable logic circuit has subparts each programmed to act as a respective subunit 310, 320, 330, 340 of the detection and measurement unit 30. Obviously, in the case wherein the system comprises a plurality of detection and measurement units 30, the latter can share a single programmable logic circuit to supply all or part of the subunits 310, 320, 330, 340 of these detection and measurement units 30 or each comprise the respective programmable logic circuit threshold or a partial sharing of the programmable logic circuits between the detection and measurement units 30.

Such configuration is permitted by a breakdown of each of the subunits into programmable logic functions in such a programmable logic circuit.

Thus, according to such a functional breakdown and as shown in FIG. 2, the detection subunit 310 can comprise:

- a first comparator 311 adapted to compare the amplitude of the representative digital signal 501 with the first triggering threshold S1, the first comparator 311 having the state 0, as a first state E1, when the amplitude of the digital representative signal is less than, or is less than or equal to, the first triggering threshold S1 and a state 1, as a second state E2, otherwise,
- a second comparator 312 adapted to compare the amplitude of the representative digital signal 501 with the second stopping threshold S2, the second comparator 312 having a state 0, as a third state E3, when the amplitude of the digital representative signal is greater than, or greater than or equal to, the second stopping threshold S2 and a state 1, as a fourth state E4, otherwise,
- a first latch 314 having a first latch input connected to the first comparator 311 and a second latch input connected to the second comparator 312, the first latch 314 being configured to switch from a state 0, as a fifth state E5, to a state 1, as a sixth state E6, when the first comparator has a state 1 (i.e. the second state E2), and to switch from the state 1 to the state 0 when the second comparator 312 has the state 1 (i.e. the fourth state E4),
- a pulse counter 316 connected to an output of the first latch 314 and configured to count a pulse each time the first latch 314 switches from a state chosen from the state 1, i.e. the sixth state E6, and the state 0, i.e. the fifth state E5, to the other state from the state 1 (E6) and the state 0 (E5).

It will be noted that the pulse counter 316 has, as illustrated in FIG. 2, a reset input connected to the analysis unit such that when the analysis unit transmits a reset signal, the pulse counter 316 transmits the number of electromagnetic pulses counted since the last reset at the interface subunit 340 and the number of electromagnetic pulses is reset to zero.

The interface subunit 340 is then configured to supply the number of pulses detected to the analysis unit 40.

Thus, with simple logical functions accessible with a programmable logic circuit, it is possible to obtain reliable detection unlike the method used within the scope of the prior art. Such reliability is shown in FIGS. 3A and 3B, FIG. 3A illustrating the risks of "false positive" type detection inherent in the use of a single threshold S'1, FIG. 3B illustrating the benefits of the use of two thresholds S1, S2.

Indeed, it can be observed, in FIG. 3A, that an electromagnetic pulse can have an erratic amplitude variation which can induce the detection of several pulses (here three pulses shown in the curve 510') whereas a single pulse should actually be detected as shown by the curve 510. In the case of the invention, the use of a first detection threshold S1 and a second stopping threshold S2 with the second stopping threshold S2 which corresponds to an amplitude less than that of the first detection threshold S1 makes it possible to avoid such a problem. Indeed, the relatively high first detection threshold makes it possible to wait for the pulse to reach a sufficiently great amplitude, while the second stopping threshold makes it possible to ensure that the pulse has indeed ended before detecting it.

Within the scope of the counting of the number of pulses, so as to allow satisfactory autonomy for the detection system 1, the pulse counter 316 is a 24-bit counter, i.e. adapted to count a number of electromagnetic pulses of up to slightly more than 16.7 million electromagnetic pulses.

Similarly, it is possible to provide the temporal pulse duration measurement subunit 320 according to such a functional breakdown. According to such an option, the temporal pulse duration measurement subunit 320 comprises:
- a first clock 321 configured to have in alternation a state 1, as a seventh state and a state 0, as an eighth state E8, with a first predefined alternating frequency,
- a first logic gate 323, having a first gate input connected to an output of the first latch 314 and a second gate input connected to the first clock 321, the first logic gate being an AND type gate and thus being configured to have a state 1, as a ninth state E9, when the first latch has the state 1 and when the first clock 321 has the state 1, the first logic gate 323 having a state 0, as a tenth state E10, the rest of the time,
- a pulse duration counter 325 connected to an output of the first logic gate 323 and configured to count a first clock pulsation each time the first logic gate 323 has the state 1, i.e. the ninth state E9, the number of alternations counted corresponding to the pulse duration.

Figure 4:
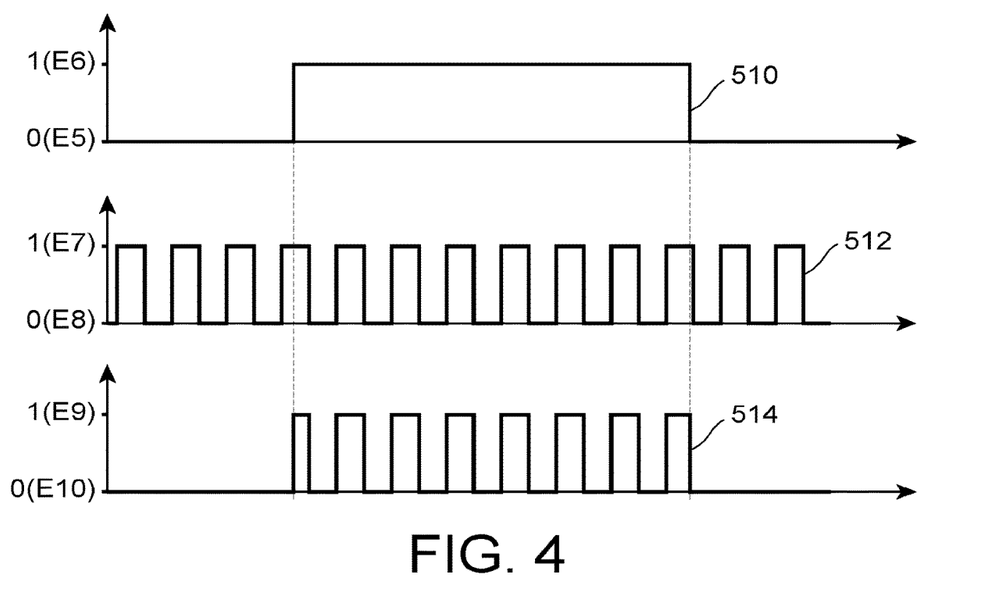
FIG. 4 illustrates a the principle of determining the duration of the electromagnetic pulses used within the scope of the invention.

The counting principle used by the temporal pulse duration measurement subunit 320 is illustrated by FIG. 4. The first graph illustrates with the curve 510 the output signal of the first latch, the switch to 1 corresponding to the detection of an electromagnetic pulse and the state 0 corresponding to the absence of electromagnetic pulses. The second graph illustrates the output 512 of the first clock 321 which switches in alternation from the state 1 to the state 0 with a given frequency, one alternation corresponding to one beat of the first clock 21. The first logic gate 323 makes it possible to combine them in order to supply the clock beats corresponding to the detection of the electromagnetic pulses as shown in the third graph with the curve 514. In this way, the pulse duration counter 325 will be able to count the number of clock beats corresponding to the detection of electromagnetic pulses. This number of beats multiplied by the period of the first clock $t_{clk}$ makes it possible to go directly back to the duration of the electromagnetic pulses between two queries.

Indeed, the pulse duration counter 325 is, like the pulse counter 316, equipped with a reset input connected to the analysis unit 40 such that when the analysis unit transmits a reset signal, the pulse duration counter 316 transmits the number of beats of the first clock 321 counted since the last reset at the interface subunit 340 and resets the number of beats of the first clock 321 counted to zero.

The interface subunit 340 is then configured to supply the number of beats of the first clock 321 counted to the analysis unit 40 which can in turn determine using this value and the number of pulses supplied by the detection subunit 310, a mean pulse duration. Such a determination can be carried out using the following equation:

$$\tau_{pulse} = \frac{N_{clk} \cdot t_{clk}}{N_{imp}}$$

Where $N_{imp}$ is the number of electromagnetic pulses supplied by the pulse counter 316, $t_{clk}$ is the clock period; $N_{clk}$ is the number of clock beats supplied by the pulse duration counter 325 and $\tau_{pulse}$ is the mean pulse duration calculated.

It will be noted that the frequency of the first clock is chosen according to the mean duration expected for the electromagnetic pulses and the temporal resolution sought. In this case, the inventors chose a frequency of 100 MHz, i.e. a resolution of 10 ns. Obviously, this value is merely provided by way of example and other frequencies are perfectly conceivable, such as a frequency between 1 MHz and 500 MHz, without leaving the scope of the invention.

In order to provide the detection and measurement unit with some autonomy, the pulse duration counter 325 can be a 32-bit counter, i.e. capable of measuring more than 4.29 billion clock pulsations.

In the same way as for the detection subunits and temporal pulse duration measurement subunit 320, the maximum pulse amplitude measurement subunit 330 can also be provided with such a functional breakdown. According to this option, the maximum pulse amplitude measurement subunit 330 can comprise a plurality of comparison units, not illustrated, each comprising a third comparator and respective latch.

The third comparator of each comparison unit is adapted to compare the amplitude of the representative digital signal with a respective third triggering threshold which is distinct from the third triggering thresholds of the other third comparators, said third comparator having a state 0, as an eleventh state, when the amplitude of the digital representative signal is less than, or is less than or equal to, the corresponding third triggering threshold and a state 1, as a twelfth state, otherwise.

The third latch of each comparison unit having a third latch input connected to the third comparator of said comparison unit, said third latch being configured to switch from a state 0, as a thirteenth state, to a state 1, as a fourteenth state, when the third comparator of said comparison unit has the state 1, i.e. the twelfth state.

The third triggering thresholds are preferably chosen to be distributed over a range of expected amplitudes for the representative digital signal.

Thus, between two queries, once the amplitude of the representative digital signal exceeds one of the third triggering thresholds, the corresponding third latch will switch from the state 0, i.e. the thirteenth state, to the state 1, i.e. the fourteenth state, and the digital signal having an amplitude greater than the third triggering threshold will be recorded by the state of said third latch. During the reset, the state of each of the three latches is transmitted to the interface subunit 340 before the third latches have all switched to the state 0, i.e. the third state. In this way, using the correspondence between the third latches and the corresponding third triggering threshold, the analysis unit is capable of determining the upper third triggering threshold which has been exceeded by the electromagnetic pulses and estimating the maximum amplitude of the electromagnetic pulses received between two resets.

With such a detection and measurement unit 30, it is thus possible with simple logic functions to obtain satisfactory detection of the electromagnetic pulses in real time and information thereon including the mean duration and the maximum amplitude.

Such a detection and measurement unit 30 is adapted to enable the use of a method for detecting and measuring pulses comprising the following steps:
- receiving a representative digital signal of the envelope of an electromagnetic signal received in a given frequency band wherein electromagnetic interference is liable to occur, such as that supplied by the processing and digitisation unit 20,
- comparing the amplitude of the representative digital signal with a first triggering threshold S1 and the second stopping threshold S2, the second stopping threshold S2 corresponding to an amplitude less than that corresponding to the first triggering threshold S2, detecting an electromagnetic pulse on each detection of the passage of the amplitude of the representative digital signal through the second stopping threshold S2 in a falling edge after the amplitude of the representative digital signal has passed through the first triggering threshold S1 in a rising edge.

Similarly, in order to determine the duration of the electromagnetic pulses, the detection and measurement unit 30 is thus adapted for the use of a method for determining the duration of the electromagnetic pulses comprising the following steps:

supplying a first clock signal having a first predefined alternating frequency, modulating the first clock signal with an electromagnetic pulse detection signal supplied during the step of detecting an electromagnetic pulse, counting the remaining clock signal number after modulation with the electromagnetic pulse detection signal.

It can also be noted that the detection and measurement unit 30 is also adapted to enable the measurement of the maximum amplitude of the electromagnetic pulses through the use of a method comprising the following steps:

comparing the amplitude of the representative digital signal with a plurality of mutually distinct third triggering thresholds in order to detect whether the amplitude of the digital signal has reached and/or exceeds said third triggering thresholds, said third triggering thresholds being distributed across a range of expected amplitudes for the representative digital signal, the third triggering threshold corresponding to the amplitude of the highest digital signal reached/exceeded by the representative signal, said third triggering threshold corresponding to the maximum amplitude measurement.

Figure 5:
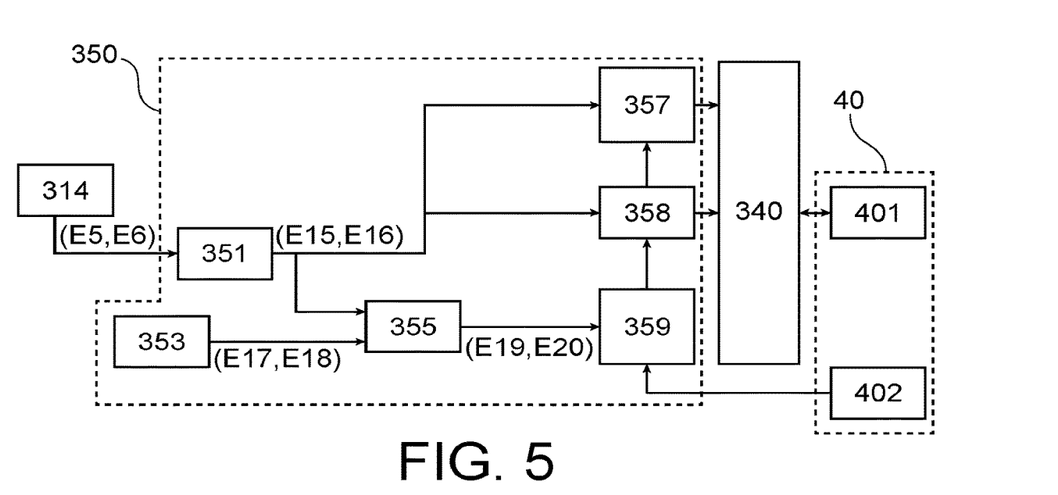
FIG. 5 illustrates a functional diagram of a subunit for measuring an electromagnetic pulse repeat period according to a second embodiment of the invention,
  FIG. 6 graphically illustrates the principle of measuring an electromagnetic pulse repeat frequency as used within the scope of the second embodiment of the invention.

A second embodiment of the detection and measurement unit 30 can, as shown in FIG. 5, further include an electromagnetic pulse repeat frequency measurement subunit 350.

Thus, a detection and measurement unit 30 according to the second embodiment differs from a detection and measurement unit 30 according to the first embodiment only in that it further comprises the electromagnetic pulse repeat period measurement subunit 350.

Figure 6:
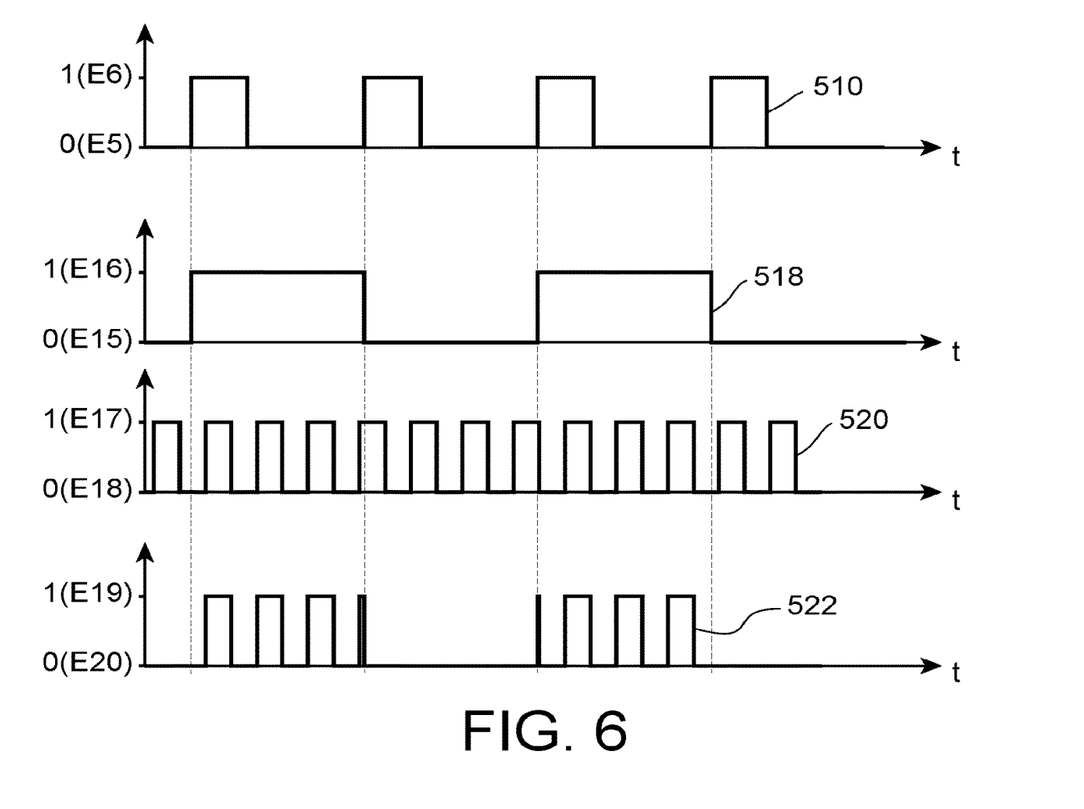

According to the configuration of the invention wherein the detection and measurement unit 30 can comprise a programmable logic circuit, it is also possible within the scope of this second embodiment to provide a functional breakdown of the electromagnetic pulse repeat period measurement subunit 350. According to this option, the electromagnetic pulse repeat period measurement subunit 350 can comprise, as illustrated in FIG. 5:

a frequency divider 351 configured to switch between a state 0, as a fifteenth state E15 and a state 1, as a sixteenth state E16, on each switch of the first latch 314 to a given state chosen from the state 0, i.e. the fifteenth state E5, and the state 1, i.e. the sixteenth state E6 (here, as will be shown with reference to FIG. 6, the switch to the state 1 (E6)), a double-period number counter 357 connected to an output of the frequency divider 351 and configured to count a period each time the frequency divider 351 switches from state chosen from the state 0, i.e. the fifteenth state E15, and the state 1, i.e. the sixteenth state E16, to the other state from the state 1 (E16) and the state 0 (E15), here on each switch in a rising edge from the state 0 (E15) to the state 1 (E16), a second clock 353 configured to have in alternation a state 1, as a seventeenth state E17, and a state 0 as an eighteenth state E18 with a second predefined alternating frequency, a second logic gate 355 having a third gate input connected to an output of the frequency divider 351 and a fourth gate input connected to the second clock 353, the second logic gate 355 being configured to have a state 1, as a nineteenth state E19, when the frequency divider 351 has the state 1, i.e. the fifteenth state E15, and when the second clock 353 has the state 1, i.e. the seventeenth state E17, the logic gate having a state 0, as a twentieth state E20, the rest of the time, a period duration counter 359 connected to a second logic gate output 355 and configured to count a second clock pulsation each time the frequency divider 351 switches from a state chosen from the state 0, i.e. the fifteenth state E15, and the state 1, i.e. the sixteenth state E16, to the other state from the state 0 (E15) and the state 1 (E16).

It will be noted that, according to this second embodiment and as illustrated in FIG. 5, the electromagnetic pulse repeat period measurement subunit 350 further comprises a buffer memory 358, connected to an output of the frequency divider 351 and the period duration counter 359, and which is configured to act as an interface between the latter and the interface subunit 340. The buffer memory 358 is more specifically configured to retrieve the value of the period duration counter 359 on each switch of the output of the frequency divider 351 to the state 0, i.e. to the fifth state E15, thereby ensuring that only the whole periods of the frequency divider 351 are taken into account.

According to this use of a buffer memory 358, the double-period number counter 357 is configured to count a period each time the frequency divider 351 switches from a state from the state 1, i.e. the sixteenth state E16, to the state 0, i.e. the seventeenth state E17, thus ensuring that only whole alternations are taken into account.

The measurement principle of the repeat period of the electromagnetic pulses is illustrated by FIG. 6. The first graph illustrates an example of a signal 510 supplied by the first latch 314 for regular electromagnetic pulses. The second graph shows the output of the frequency divider 351 when it receives the signal 510, it will be noted that the signal 518 at the output of the frequency divider 351 corresponds, as it should, to two periods of that of the electromagnetic pulses. Thus, the signal 518 has the state 1 for one period out of two at the output of the first latch 314. The third graph illustrates the output 520 of the second clock 353 which switches in alternation from the state 1 to the state 0 with a second given frequency. The second logic gate 355 makes it possible to combine them in order to supply the clock beats corresponding to one period out of two of the signal 510 corresponding to the electromagnetic pulses as shown in the fourth graph with the curve 522. In this way, the period duration counter 359 will be able to count the number of beats of the second clock corresponding to one period out of two d. This number of beats multiplied by the period of the second clock $t_{clk2}$ makes it possible to go directly back to the duration of the electromagnetic pulses between two queries.

Indeed, the period duration counter 359 and the buffer memory 358 are, like the pulse counter 316, equipped with a reset input connected to the analysis unit 40, here via the period duration counter 359 for the buffer memory, such that when the analysis unit 40 transmits a reset signal, the buffer memory 358 transmits to the interface subunit 340 the number of beats of the second clock 321 counted since the last reset for whole alternations of the frequency divider 351 and the number of beats of the second clock 355 of the buffer memory 358 and the period duration counter 359 is reset to zero.

Similarly, the double-period number counter 357 is also equipped with a reset input connected to the analysis unit 40 via, here, the period duration counter 359 and the buffer memory, such that when the analysis unit 40 transmits a reset signal, the double-period number counter 357 transmits the number of double-periods counted since the last reset, these double-periods only including, preferably, whole double-periods, and the number of double-periods counted of the double-period number counter 357 is reset to zero.

The interface subunit 340 is then configured to supply the number of beats $N_{clk2}$ of the second clock 321 counted at the analysis unit 40 which can in turn determine using this value and the number of double-periods $N_{div}$ supplied by the double-period number counter 357, a mean frequency of the electromagnetic interference. Such a determination can be carried out using the following equation:

$$f_{imp} = \frac{N_{div}}{N_{clk2} \cdot t_{clk2}}$$

Where $N_{div}$ is the number of double-periods supplied by the double-period number counter 357, $t_{clk2}$ is the period of the second clock; $N_{clk2}$ is the number of beats of the second clock 321 counted by the period duration counter 359 and $f_{imp}$ is the mean frequency of the electromagnetic pulses determined.

It will be noted that the frequency of the second clock is chosen according to the frequency expected for the electromagnetic pulses and the resolution sought. In this case, the inventors chose a frequency of 10 MHz, which corresponds to an expected frequency less than 10 MHz. Obviously, this value is merely provided by way of example and other frequencies are perfectly conceivable, such as a frequency between 10 kHz and 50 MHz, without leaving the scope of the invention.

In order to provide the detection and measurement unit 30 with some autonomy, the double-period number counter 357 can be a 32-bit counter, i.e. capable of counting more than 4.29 billion double-periods and the period duration counter 359 can be a 32-bit counter, i.e. capable of measuring more than 4.29 billion second clock pulsations.

It will be noted, whether within the scope of the first embodiment or in the second embodiment, the different functional states of the different subunits have states chosen arbitrarily as being 1 or 0 so as to facilitate the reading of this document. Obviously, some, or all of these states, can be inverted without leaving the scope of the invention. Similarly, with such state inversions, for example, in the case where the output of the first latch is inverted, the first logic gate can then be of the exclusive or type, i.e. capable of switching to the state 1 when the first latch and the first clock each have the state 0.

The invention claimed is:

1. A detection and measurement unit for detecting electromagnetic interference, wherein the detection and measurement unit is configured to receive a digital signal representative of the envelope of an electromagnetic wave received in a given frequency band,
the measurement and detection unit comprising:

a detection subunit configured to compare the amplitude of the digital signal representative of the envelope with a first triggering threshold and a second stopping threshold, the second stopping threshold corresponding to an amplitude less than that corresponding to the first triggering threshold, the detection subunit being furthermore configured to detect an electromagnetic pulse on each new double detection of the passage of the amplitude of the digital signal through the first triggering threshold in a rising edge followed by the passage of the amplitude of the digital signal through the second stopping threshold in a falling edge, wherein the detection and measurement unit comprises a programmable logic circuit which was previously programmed to act as a detection subunit.

2. The detection and measurement unit according to claim 1, wherein the detection and measurement unit further comprises a temporal pulse duration measurement subunit communicating with the detection subunit, the temporal pulse duration measurement subunit being configured to measure the pulse duration between the passages by the amplitude of the digital signal of the first triggering threshold in a rising edge and the passage of the second stopping threshold in a falling edge.

3. The detection and measurement unit according to claim 1, wherein the detection subunit comprises:

a first comparator adapted to compare the amplitude of the digital signal with the first triggering threshold, the first comparator having a first state when the amplitude of the digital signal is less than, or is less than or equal to, the first triggering threshold and a second state otherwise, a second comparator adapted to compare the amplitude of the digital signal with the second stopping threshold, the second comparator having a third state when the amplitude of the digital signal is greater than, or is greater than or equal to, the second stopping threshold and a fourth state otherwise, a first latch having a first latch input connected to the first comparator and a second latch input connected to the second comparator, the first latch being configured to switch from a fifth state to a sixth state when the first comparator has the second state, and to switch from the sixth state to the fifth state when the second comparator has the fourth state, a pulse counter connected to an output of the first latch and configured to count a pulse each time the first latch switches from a state chosen from the sixth state and the fifth state to the other state from the sixth state and the fifth state.

4. The detection and measurement unit according to claim 3, wherein the detection and measurement unit further comprises a temporal pulse duration measurement subunit communicating with the detection subunit, the temporal pulse duration measurement subunit being configured to measure the pulse duration between the passages by the amplitude of the digital signal of the first triggering threshold in a rising edge and the passage of the second stopping threshold in a falling edge, wherein the temporal pulse duration measurement subunit comprises:

a first clock configured for have in alternation a seventh state and an eighth state with a first predefined alternating frequency, a first logic gate having a first gate input connected to an output of the first latch and a second gate input connected to the first clock, the first logic gate being configured to have a ninth state when the first latch has the sixth state and when the clock has the seventh state, the first logic gate having a tenth state the rest of the time, a pulse duration counter connected to an output of the first logic gate and configured to count a first clock pulsation each time the first logic gate has the ninth state, the number of alternations counted corresponding to the pulse duration.

5. The detection and measurement unit according to claim 1, further comprising a maximum pulse amplitude measurement subunit capable of measuring a maximum amplitude level reached by the digital signal.

6. The detection and measurement unit according to claim 5, wherein the maximum pulse amplitude measurement subunit comprises a plurality of comparison units each comprising a third comparator and respective latch, the third comparator of each comparison unit being adapted to compare the amplitude of the digital signal with a respective third triggering threshold which is distinct from the third triggering threshold of the other third comparators, said third comparator having an eleventh state, when the amplitude of the digital signal is less than, or is less than or equal to, the corresponding third triggering threshold and a twelfth state otherwise, the third latch of each comparison unit having a third latch input connected to the third comparator of said comparison unit, said third latch being configured to switch from a thirteenth state to a fourteenth state when the third comparator of said comparison unit has the twelfth state, the comparison units being configured so that the third triggering thresholds of the third comparators are distributed across a range of expected amplitudes for the digital signal.

7. The detection and measurement unit according to claim 1, further comprising an electromagnetic pulse repeat period measurement subunit.

8. The detection and measurement unit according to claim 3, further comprising an electromagnetic pulse repeat period measurement subunit, wherein the electromagnetic pulse repeat period measurement subunit comprises:

a frequency divider configured to switch between a fifteenth state and sixteenth state on each switch of the first latch to a given state chosen from the fifth state and the sixth state, a double-period number counter connected to an output of the frequency divider and configured to count a double-period each time the frequency divider switches from a state chosen from the fifteenth state and the sixteenth state to the other state from the fifteenth state and the sixteenth state, a second clock configured for have in alternation a seventeenth state and an eighteenth state with a second predefined alternating frequency, a second logic gate having a third gate input connected to an output of the frequency divider and a fourth gate input connected to the second clock, the second logic gate being configured to have a nineteenth state when the frequency divider has the fifteenth state and when the second clock has the seventeenth state, the logic gate having a twentieth state the rest of the time, a period duration counter connected to an output of the second logic gate and configured to count a second clock pulsation each time the frequency divider switches from a state chosen from the fifteenth state and the sixteenth state to the other state from the fifteenth state and the sixteenth state.

9. The detection and measurement unit according to claim further comprising a buffer memory configured to retrieve the value of the period duration counter on each switch of the frequency divider from the sixteenth state to the fifteenth state.

10. The detection and measurement unit according to claim 1, wherein the detection subunit is configured to receive a reset signal and to carry out, on receiving this reset signal, a supply of a number of electromagnetic pulses detected since a previous reset and a reset to zero of a counting of the number of electromagnetic pulses.

11. The detection and measurement unit according to claim 1, wherein the programmable logic circuit is a complex programmable logic circuit, better known under the acronym CPLD.

12. An electromagnetic interference detection system comprising:

a unit for receiving electromagnetic signals configured to receive at least a portion of an electromagnetic radiation to which the detection system is subjected in the form of an electromagnetic wave received in a given frequency band and to supply a digital signal representative of the envelope of said electromagnetic wave, an detection and measurement unit according to claim 1.

13. An analysis method for detecting electromagnetic interference carried out using a programmable logic circuit which was previously programmed to act as a detection subunit, the method comprising the steps of:

receiving a digital signal representative of the envelope of an electromagnetic wave received in a given frequency band, comparing the amplitude of the digital signal representative of the envelope with a first triggering threshold and a second stopping threshold, the second stopping threshold corresponding to an amplitude less than that corresponding to the first triggering threshold, detecting an electromagnetic pulse on each new double detection of the passage of the amplitude of the digital signal through the first triggering threshold in a rising edge followed by the passage of the amplitude of the digital signal through the second stopping threshold in a falling edge.

14. The analysis method for detecting electromagnetic interference according to claim 13, further comprising the steps of:

supplying a first clock signal having a first predefined alternating frequency, modulating the first clock signal with an electromagnetic pulse detection signal supplied during the step of detecting an electromagnetic pulse, counting the remaining clock signal number after modulation with the electromagnetic pulse detection signal.

* * * * *